United States Patent
Kim

(10) Patent No.: US 7,413,960 B2
(45) Date of Patent: Aug. 19, 2008

(54) METHOD OF FORMING FLOATING GATE ELECTRODE IN FLASH MEMORY DEVICE

(75) Inventor: Jae Heon Kim, Icheon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 18 days.

(21) Appl. No.: 11/169,892

(22) Filed: Jun. 30, 2005

(65) Prior Publication Data

US 2006/0205158 A1  Sep. 14, 2006

(30) Foreign Application Priority Data

Mar. 9, 2005  (KR) .................... 10-2005-0019633

(51) Int. Cl.
*H01L 21/44* (2006.01)
*H01L 21/84* (2006.01)

(52) U.S. Cl. ................. 438/424; 438/694; 438/695; 438/667; 438/709; 438/717; 257/E21.252; 257/E21.314

(58) Field of Classification Search ............... 438/257, 438/424, 694, 695, 667, 709, 717, 736; 257/E21.252, 257/E21.314
See application file for complete search history.

(56) References Cited

U.S. PATENT DOCUMENTS

| | | | |
|---|---|---|---|
| 5,973,353 A * | 10/1999 | Yang et al. .................. | 257/315 |
| 6,060,399 A * | 5/2000 | Kim et al. .................... | 438/706 |
| 6,222,225 B1 * | 4/2001 | Nakamura et al. .......... | 257/315 |
| 6,284,637 B1 * | 9/2001 | Chhagan et al. ............. | 438/594 |
| 6,309,928 B1 * | 10/2001 | Sung et al. .................. | 438/265 |
| 6,482,728 B2 * | 11/2002 | Shin et al. ................... | 438/593 |
| 6,498,083 B2 | 12/2002 | Nastasi et al. | |
| 6,521,941 B2 | 2/2003 | Park et al. | |

(Continued)

FOREIGN PATENT DOCUMENTS

KR  1020040076982  9/2004

(Continued)

OTHER PUBLICATIONS

Foreign Notice of Allowance for Taiwanese patent app. 94121776.

*Primary Examiner*—Michael S Lebentritt
(74) *Attorney, Agent, or Firm*—Lowe Hauptman Ham & Berner LLP

(57) ABSTRACT

A method of forming a floating gate electrode in a flash memory device. The method includes forming an isolation film in an inactive region so that a step with a predetermined thickness can be generated between an active region and the inactive region, which are defined in a semiconductor substrate, sequentially forming a tunnel oxide film, a polysilicon film for floating gate electrode and an anti-reflection film on the entire surface in which the isolation film is formed, and then forming photoresist patterns in predetermined regions of the anti-reflection film. The method further includes patterning the anti-reflection film using the photoresist patterns as an etch mask to form a patterned anti-reflection film in which a bottom surface is wider than a top surface and a slope is formed on sidewalls, and pattering the polysilicon film for the floating gate electrode, the tunnel oxide film and a predetermined thickness of the isolation film using the patterned anti-reflection film as an etch mask, thus forming the floating gate electrode having a slope on sidewalls.

16 Claims, 2 Drawing Sheets

U.S. PATENT DOCUMENTS

| | | | |
|---|---|---|---|
| 6,743,675 B2 * | 6/2004 | Ding | 438/257 |
| 6,762,452 B2 | 7/2004 | Nastasi et al. | |
| 6,809,033 B1 * | 10/2004 | Hui et al. | 438/694 |
| 6,849,531 B1 * | 2/2005 | Lin et al. | 438/585 |
| 7,067,389 B2 * | 6/2006 | Lee et al. | 438/424 |
| 7,211,484 B2 * | 5/2007 | Lee et al. | 438/257 |
| 2003/0119257 A1 * | 6/2003 | Dong et al. | 438/257 |
| 2006/0163686 A1 * | 7/2006 | Liu et al. | 257/501 |

FOREIGN PATENT DOCUMENTS

| | | |
|---|---|---|
| KR | 1020050002246 | 1/2005 |
| KR | 1020050002412 | 1/2005 |
| KR | 1020060007983 | 1/2006 |
| TW | 550827 | 9/2003 |
| TW | 556352 | 10/2003 |

* cited by examiner

METHOD OF FORMING FLOATING GATE ELECTRODE IN FLASH MEMORY DEVICE

BACKGROUND

1. Field of the Invention

The present invention relates to a method of fabricating a flash memory device. Mmore specifically, the present invention relates to a method of forming a floating gate electrode in a flash memory device.

2. Discussion of Related Art

Generally, a floating gate formation process in a flash memory device is an important process since the design of the device gets smaller. That is, a floating gate electrode formation process is one of the critical processes that decide the dimension and characteristics of devices because a short phenomenon has to be taken into consideration, active attack of an active region due to the shortage of overlay margin has to be taken into consideration, and an effort has to be made to secure a minimum coupling ratio necessary for element driving.

Therefore, in order to decide the dimension and characteristics of devices, there is a need for a floating gate electrode formation process in which problems, such as a short phenomenon, active attach of an active region and a coupling ratio, are obviated.

SUMMARY OF THE INVENTION

Accordingly, the present invention has been made in view of the above problems, and it is an object of the present invention to provide a method of forming a floating gate electrode in a flash memory device, wherein a short phenomenon is taken into consideration, active attack of an active region due to the shortage of overlay margin is taken into consideration, and a minimum coupling ratio necessary for element driving is secured.

To achieve the above object, according to an aspect of the present invention, there is provided a method of forming a floating gate electrode in a flash memory device, including the steps of forming an isolation film in an inactive region so that a step with a predetermined thickness can be generated between an active region and the inactive region, which are defined in a semiconductor substrate, sequentially forming a tunnel oxide film, a polysilicon film for floating gate electrode and an anti-reflection film on the entire surface in which the isolation film is formed, and then forming photoresist patterns in predetermined regions of the anti-reflection film. The method further includes patterning the anti-reflection film using the photoresist patterns as an etch mask to form a patterned anti-reflection film in which a bottom surface is wider than a top surface and a slope is formed on sidewalls, and patterning the polysilicon film for the floating gate electrode, the tunnel oxide film and a predetermined thickness of the isolation film using the patterned anti-reflection film as an etch mask, thus forming the floating gate electrode having a slope on sidewalls.

The step with the predetermined thickness between the active region and the inactive region is, in embodiments, higher than the EFH.

The EFH is, in embodiments, 100 Å in thickness.

The patterned anti-reflection film may, in embodiments, be formed by means of an etch process using HBr gas.

The floating gate electrode having the slope on the sidewalls may, in embodiments, be formed by means of an etch process using a mixed gas of $Cl_2$, $O_2$, HBr and $N_2$.

The step with the predetermined thickness between the active region and the inactive region, which is higher than the EFH, may, in embodiments, remain as high as the EFH in a patterning process of the floating gate electrode.

According to another aspect of the present invention, there is provided a method of forming a floating gate electrode in a flash memory device, including the steps of forming an isolation film in an inactive region so that a step with a predetermined thickness can be generated between an active region and the inactive region, which are defined in a semiconductor substrate, forming a polysilicon film for the floating gate electrode on the entire surface in which the isolation film is formed, and forming a patterned anti-reflection film in which a bottom surface is wider than a top surface and its sidewalls have a slop in the active region on the polysilicon film, and patterning the polysilicon film for floating gate electrode and a predetermined thickness of the isolation film using the patterned anti-reflection film as a mask, thus forming the floating gate electrode having a slope on its sidewalls.

The step with the predetermined thickness between the active region and the inactive region is, in embodiments, higher than the EFH.

The step with the predetermined thickness between the active region and the inactive region, which is higher than the EFH, may, in embodiments, remain as high as the EFH in a patterning process of the floating gate electrode.

The patterned anti-reflection film in which the bottom surface is wider than the top surface and its sidewalls have a slope may, in embodiments, be formed by forming an anti-reflection film on the polysilicon film, forming photoresist patterns on the anti-reflection film, and then performing an etch process using HBr gas by using the photoresist patterns as an etch mask.

DETAILED DESCRIPTION OF PREFERRED EMBODIMENTS

Figure 1:
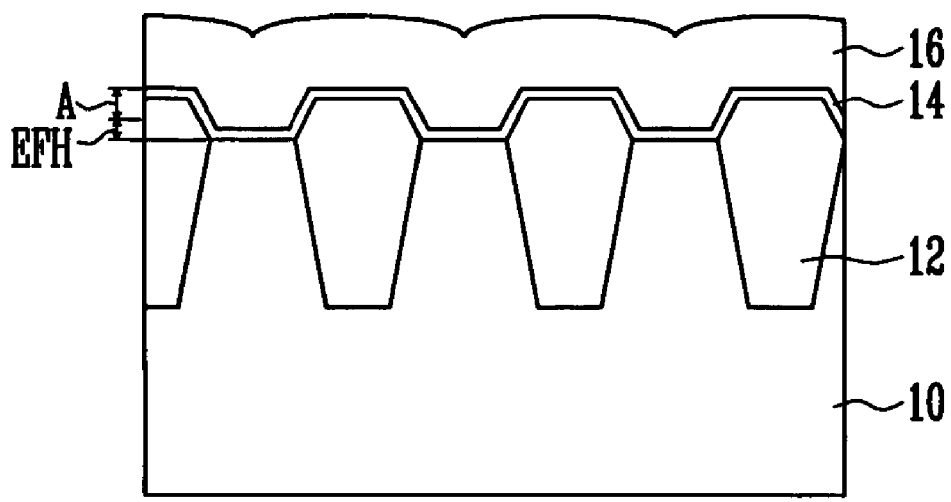
FIGS. 1 to 4 are cross-sectional views for explaining a method of forming a floating gate electrode in a flash memory device according to an embodiment of the present invention.

Embodiments according to the present invention will be described with reference to the accompanying drawings. Since the embodiments are provided so that a person of ordinary skill in the art will be able to understand the present invention, the embodiments may be modified in various manners and the scope of the present invention is not limited by the embodiments described herein. In instances where it is described that one film is "on" the other film or a semiconductor substrate, the one film may directly contact the other film or the semiconductor substrate. Or, a third film may be intervened between the one film and the other film or the semiconductor substrate. Furthermore, in the drawings, the thickness and size of each layer are exaggerated for convenience of explanation and clarity. Like reference numerals are used to identify the same or similar parts.

FIGS. 1 to 4 are cross-sectional views for explaining a method of forming a floating gate electrode in a flash memory device according to an embodiment of the present invention.

Referring to FIG. 1, a tunnel oxide film 14 and a polysilicon film 16 for a floating gate electrode are sequentially formed on a semiconductor substrate 10 having an isolation film 12.

Before the tunnel oxide film 14 and the polysilicon film 16 are formed, a gate oxide film (not shown), a pad nitride film (not shown) and a pad oxide film (not shown) are sequentially formed on the semiconductor substrate 10. A photoresist patterns (not shown) for defining a trench is then formed in a predetermined region on the pad oxide film. If an etch process is performed on the pad oxide film using the photoresist patterns (not shown) as an etch mask, the pad oxide film is patterned. An ashing process for removing the photoresist patterns (not shown) of the resulting including the patterned pad oxide film is then performed. Therefore, the pad nitride film, the gate oxide film and a predetermined depth of the semiconductor substrate are etched using the patterned pad oxide film as an etch mask, thus forming a trench.

An insulating film for trench burial such as a HDP (High Density Plasma) oxide film is formed on the entire surface including the trench. A polishing process, such as a CMP (Chemical Mechanical Polishing) process, is performed until the pad oxide film is exposed, thus forming an isolation film 12. If an etch process for removing the pad oxide film, the pad nitride film and the gate insulating film is performed, the formation process of the isolation film 12 is completed.

A step is generated between a region where the isolation film is formed, i.e., an inactive region and a region where the isolation film is not formed, i.e., an active region due to the formation of the isolation film 12. This step is called an effective field oxide layer height (EFH). It is required that the EFH be maintained even after an etch process for forming the floating gate electrode is performed. Accordingly, the isolation film is higher than the EFH, as high as "A" in FIG. 1. This is because the EFH can be maintained although the isolation film is stripped to a predetermined thickness in a subsequent etch process for forming a floating gate electrode.

The EFH is about 100 Å in thickness and the height as high as "A" is about 50 Å in thickness.

If the etch process for forming the floating gate electrode is performed so as to maintain the EFH, a short is prevented from occurring between the polysilicon film and the active region of the semiconductor substrate although a overlay shift is generated.

Figure 2:
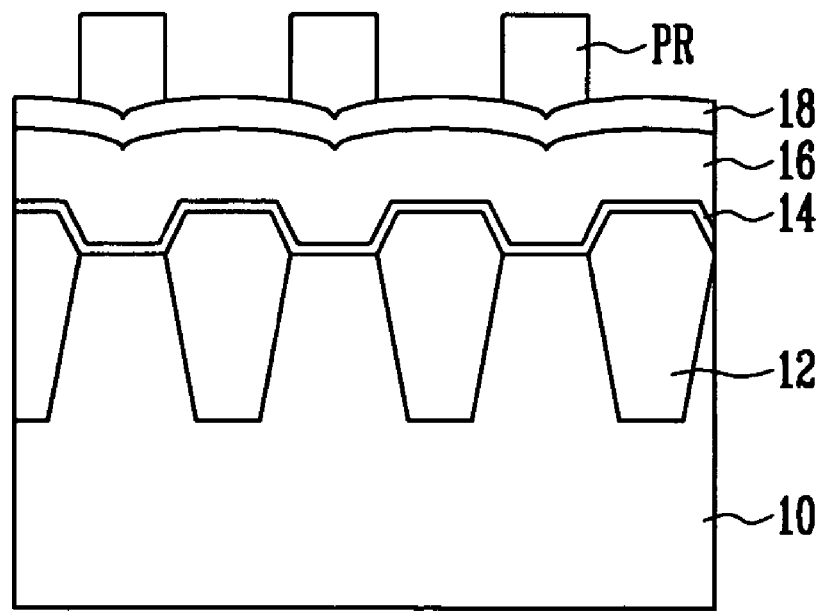

Referring to FIG. 2, an organic BARC (Organic Bottom Anti-reflection Coating) film 18 is formed on the polysilicon film 16 for the floating gate electrode. Photoresist patterns PR for defining the floating gate electrode are formed in predetermined regions on the organic BARC film 18.

A top area of a floating gate electrode is generally increased by patterning the floating gate electrode using a hard mask and sidewalls of a hard mask. However, this method is disadvantageous in that a manufacturing time and cost are increased since lots of process steps are added. Accordingly, in the present invention, the floating gate electrode is patterned using the organic BARC film 18 and the photoresist patterns PR so that a manufacturing time and cost can be reduced and the top area of the floating gate electrode can be increased.

Figure 3:
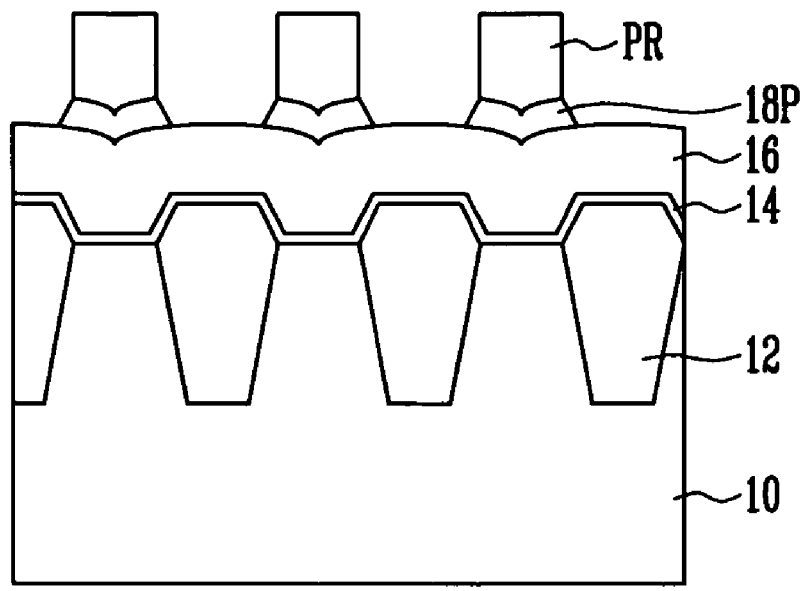

Referring to FIG. 3, the organic BARC film 18 is etched using the photoresist patterns PR as an etch mask, thus forming a patterned organic BARC film 18P.

The etch process for forming the patterned organic BARC film 18P is performed using an HBr gas.

If the etch process is performed on the organic BARC film using the HBr gas, loss of the photoresist patterns PR is minimized.

Further, since the polymer generated in the etch process is deposited at the bottom of the organic BARC film that is patterned, the patterned organic BARC film 18P in which a top surface is wider than a bottom surface and sidewalls have a slope is formed.

If the patterned organic BARC film 18P having the slope is used as an etch mask in a subsequent etch process for forming a floating gate electrode, a floating gate electrode having a slope on its sidewalls is formed. By forming the floating gate electrode having the slope on the sidewalls, a development inspection critical dimension (hereinafter, referred to as "DICD") of the floating gate electrode is greater than that of the floating gate electrode having a vertical sidewall.

Figure 4:
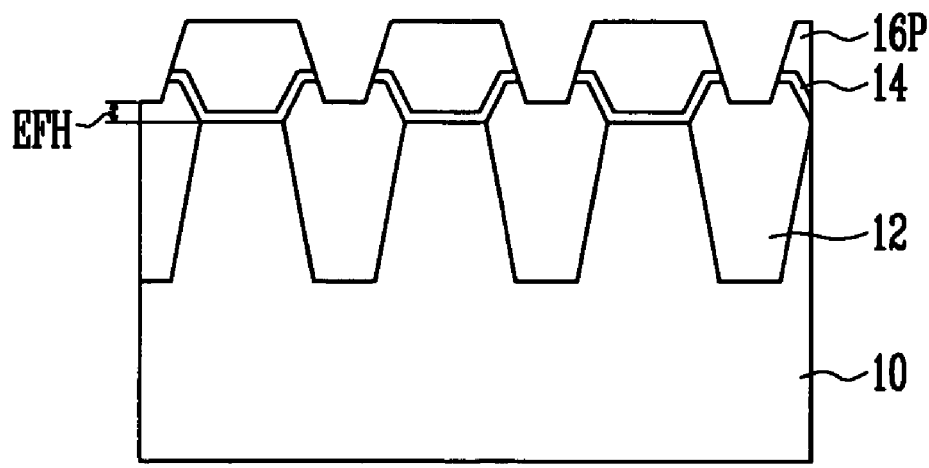

Referring to FIG. 4, an ashing process for removing the photoresist patterns PR is performed. If the polysilicon film is etched using only the patterned organic BARC film 18P as an etch mask, a floating gate electrode 16P having a slope on its sidewalls is formed.

Thereafter, a process of removing the patterned organic BARC film is performed, thereby completing the present process.

The etch process of the polysilicon film is performed using a mixed gas of $Cl_2$, $O_2$, HBr and $N_2$ by introducing an EPD (End Point Detect) system for uniformly maintaining an etch target.

After the etch process is performed, a WAC (Waferless Auto Clean) process is performed in order to improve the stability and reappearance of a process using polymer generated in the etch process of the polysilicon film.

The WAC process is performed using a mixed gas of $SF_6$ and $O_2$.

In the etch process of the polysilicon film, the tunnel oxide film 14 located at the bottom of the polysilicon film and a predetermined thickness of the isolation film are stripped. In this case, the EFH has to be maintained although a predetermined thickness of the isolation film is removed. That is, if a polysilicon film is etched only until the EFH is maintained in an etch process, generation of short between the polysilicon film and the active region of the semiconductor substrate can be prevented within a predetermined margin although an overlay shift occurs in the etch process.

As described above, according to the present invention, in an etch process for forming a floating gate electrode, a polysilicon film is etched only until the EFH is maintained. Accordingly, there is an effect in that generation of a short between the polysilicon film and an active region of a semiconductor substrate can be prevented within a predetermined margin although an overlay shift occurs in the etch process.

Furthermore, according to the present invention, a floating gate electrode is patterned using a patterned organic BARC film having a slope as an etch mask. Thus, DICD can be increased after the floating gate electrode is developed. Accordingly, there is an effect in that a minimal coupling ratio necessary for element driving can be secured.

Furthermore, according to the present invention, a floating gate electrode is patterned using an organic BARC film and a photoresist patterns. Accordingly, there are effects in that a manufacturing time and cost can be reduced compared to conventional processes used in a hard mask, a spacer, etc., and a top area of a floating gate electrode can be increased.

Although the foregoing description has been made with reference to the above embodiments, it is to be understood that changes and modifications of the present invention may be made by a pereson of ordinary skill in the art without departing from the spirit and scope of the present invention and appended claims.

What is claimed is:

1. A method of forming a floating gate electrode in a flash memory device, comprising:

forming an isolation film in an inactive region so that a step with a predetermined thickness can be generated between an active region and the inactive region, the active and inactive region being defined on a semiconductor substrate;

sequentially forming a tunnel oxide film, a polysilicon film for the floating gate electrode and an organic anti-reflection film over the polysilicon film, and then forming photoresist patterns on predetermined regions of the organic anti-reflection film;

forming a patterned organic anti-reflection film having a bottom surface wider than a top surface and a slope at both sidewalls on the polysilicon film using the photoresist patterns as an etch mask; and patterning the polysilicon film for the floating gate electrode, the tunnel oxide film and a predetermined thickness of the isolation film using the patterned organic anti-reflection film as an etch mask, thus forming the floating gate electrode having a slope on top and bottom of the sidewalls.

2. The method as claimed in claim 1, wherein the step with the predetermined thickness between the active region and the inactive region is higher than the EFH.

3. The method as claimed in claim 2, wherein the EFH is 100 Å in thickness.

4. The method as claimed in claim 2, wherein the step with the predetermined thickness between the active region and the inactive region, which is higher than the EFH, remains as high as the EFH in a patterning process of the floating gate electrode.

5. The method as claimed in claim 1, wherein the patterned anti-reflection film is formed by means of an etch process using HBr gas.

6. The method as claimed in claim 1, wherein the floating gate electrode having the slope on the sidewalls is formed by means of an etch process using a mixed gas of $Cl_2$, $O_2$, HBr and $N_2$.

7. A method of forming a floating gate electrode in a flash memory device, comprising:

forming an isolation film in an inactive region so that a step with a predetermined thickness can be generated between an active region and the inactive region, the active and inactive regions being defined on a semiconductor substrate;

forming a polysilicon film for the floating gate electrode on the entire surface in which the isolation film is formed;

forming a patterned organic anti-reflection film in which a bottom surface is wider than a top surface and its sidewalls has a slope in the active region on the polysilicon film; and patterning the polysilicon film for the floating gate electrode and a predetermined thickness of the isolation film using the patterned organic anti-reflection film as a mask, thus forming the floating gate electrode having a slope on its sidewalls.

8. The method as claimed in claim 7, wherein the step with the predetermined thickness between the active region and the inactive region is higher than the EFH.

9. The method as claimed in claim 8, wherein the step with the predetermined thickness between the active region and the inactive region, which is higher than the EFH, remains as high as the EFH in a patterning process of the floating gate electrode.

10. The method as claimed in claim 7, wherein the patterned anti-reflection film in which the bottom surface is wider than the top surface and its sidewalls has the slope is formed by forming an anti-reflection film on the polysilicon film, forming photoresist patterns on the anti-reflection film, and then performing an etch process using HBr gas by using the photoresist patterns as an etch mask.

11. The method as claimed in claim 7, wherein the floating gate electrode has the slope on top and bottom of the sidewalls.

12. A method of forming a floating gate electrode in a flash memory device, comprising:

forming a tunnel oxide film and a polysilicon film for the floating gate electrode on a semiconductor substrate including a isolation film having a height higher than an Effective Field oxide layer Height (EFH);

forming an isolation film in an inactive region so that a step with a predetermined thickness can be generated between an active region and the inactive region, the active and inactive region being defined on a semiconductor substrate;

forming an organic anti-reflection film on the polysilicon film for the floating gate electrode;

forming a patterned organic anti-reflection film having a slope on both sidewalls thereof and having a bottom surface wider than a top surface by performing a first etching process;

forming the floating gate electrode having a slope on sidewalls by performing a second etching process to etch the polysilicon film, the tunnel oxide film and a predetermined thickness of the isolation film until the EFH is maintained using the patterned organic anti-reflection film as an etch mask.

13. The method as claimed in claim 12, wherein the floating gate electrode has the slope on top and bottom of the sidewalls.

14. The method as claimed in claim 13, wherein the EFH is 100 Å in thickness.

15. The method as claimed in claim 13, wherein the first etching process is performed using HBr gas.

16. The method as claimed in claim 13, wherein the second etching process is performed using a mixed gas of $Cl_2$, $O_2$, HBr and $N_2$.

* * * * *